(12) United States Patent
Jeon et al.

(10) Patent No.: US 12,402,446 B2
(45) Date of Patent: Aug. 26, 2025

(54) DISPLAY DEVICE AND METHOD OF MANUFACTURING THE SAME

(71) Applicant: Samsung Display Co., LTD., Yongin-si (KR)

(72) Inventors: Hyung Il Jeon, Yongin-si (KR); Min Woo Kim, Yongin-si (KR); Sung Kook Park, Yongin-si (KR); Sung Eun Baek, Yongin-si (KR); Ki Seong Seo, Yongin-si (KR); Jin Woo Choi, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 581 days.

(21) Appl. No.: 17/850,412

(22) Filed: Jun. 27, 2022

(65) Prior Publication Data
US 2023/0064695 A1    Mar. 2, 2023

(30) Foreign Application Priority Data

Aug. 26, 2021   (KR) .......................... 10-2021-0113431

(51) Int. Cl.
  *H10H 20/831* (2025.01)
  *H10H 20/01* (2025.01)
  (Continued)

(52) U.S. Cl.
  CPC ........ *H10H 20/8316* (2025.01); *H10H 20/01* (2025.01); *H10H 20/8514* (2025.01);
  (Continued)

(58) Field of Classification Search
  CPC ............... H10H 20/8316; H10H 20/01; H10H 20/8514; H10H 20/857; H10H 20/032; H10H 20/0361; H10H 20/812; H10H 29/142; H10H 29/8513; H10H 20/018; H10H 20/0364; H10H 20/819;
  (Continued)

(56) References Cited

U.S. PATENT DOCUMENTS 8,987,765 B2   3/2015   Bibl et al.
9,029,880 B2   5/2015   Sakariya et al.
(Continued)

FOREIGN PATENT DOCUMENTS

CN        111769108        10/2020

*Primary Examiner* — Sitaramarao S Yechuri
(74) *Attorney, Agent, or Firm* — CANTOR COLBURN LLP

(57) ABSTRACT

A display device includes a substrate, a first electrode disposed on the substrate, a bonding electrode disposed on the first electrode and electrically connected to the first electrode, a light emitting element disposed on the bonding electrode and including a first end contacting with the bonding electrode, and a second end disposed opposite to the first end in a longitudinal direction, a first insulating layer covering a side surface of the light emitting element and not covering the second end of the light emitting element such that the second end of the light emitting element is exposed, a second electrode covering the first insulating layer and the second end of the light emitting element, a first bank disposed on a portion of the second electrode, and a second bank disposed on the first bank, and the first bank and the second bank include metal.

18 Claims, 20 Drawing Sheets

(51) Int. Cl.
*H10H 20/851* (2025.01)
*H10H 20/857* (2025.01)
*H10H 29/14* (2025.01)

(52) U.S. Cl.
CPC ........ *H10H 20/857* (2025.01); *H10H 29/142* (2025.01); *H10H 20/032* (2025.01); *H10H 20/0361* (2025.01)

(58) Field of Classification Search
CPC ........... H10H 20/8513; H10H 20/8515; H10H 20/882; H10H 20/8506; A61K 40/4238; H01L 25/167; H01L 25/0753; H05K 5/10; H10D 8/043; H10D 10/056; H10D 30/0295; H10D 30/64; G02B 5/201
See application file for complete search history.

(56) References Cited

U.S. PATENT DOCUMENTS

| | | |
|---|---|---|
| 9,240,397 B2 | 1/2016 | Bibl et al. |
| 10,062,675 B2 | 8/2018 | Chang et al. |
| 10,636,349 B2 | 4/2020 | Shin et al. |
| 10,784,241 B2 | 9/2020 | Chang et al. |
| 11,067,879 B2 | 7/2021 | Choy et al. |
| 2015/0171372 A1* | 6/2015 | Iwata ........................ C09D 7/65 257/89 |
| 2016/0163765 A1* | 6/2016 | Hu ........................ H10K 77/111 438/34 |
| 2018/0047880 A1* | 2/2018 | Lim .................... H10H 20/8513 |
| 2019/0179222 A1* | 6/2019 | Choy ..................... H05B 45/30 |
| 2020/0066787 A1* | 2/2020 | Park ..................... H10D 84/858 |
| 2021/0265540 A1* | 8/2021 | Itou ....................... H01L 25/167 |

\* cited by examiner

170: 170a, 170b

DISPLAY DEVICE AND METHOD OF MANUFACTURING THE SAME

CROSS-REFERENCE TO RELATED APPLICATION(S)

This application claims priority to and the benefit of Korean Patent Application No. 10-2021-0113431 under 35 U.S.C. § 119, filed in the Korean Intellectual Property Office (KIPO) on Aug. 26, 2021, the entire content of which is incorporated herein by reference.

BACKGROUND

1. Technical Field

The disclosure relates to a display device and a method of manufacturing the same.

2. Description of the Related Art

As interest in an information display is increasing and a demand for using a portable information media is increasing, a demand and commercialization for a display device are being focused.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure is to provide a display device in which a light emitting element and a bonding electrode may be stably bonded, and a method of manufacturing the display device.

According to an embodiment of the disclosure, a display device may include a first electrode disposed on a substrate, a bonding electrode disposed on the first electrode and electrically connected to the first electrode, a light emitting element disposed on the bonding electrode and including a first end contacting the bonding electrode, and a second end disposed opposite to the first end in a longitudinal direction, a first insulating layer partially covering the light emitting element such that the second end of the light emitting element is exposed, a second electrode covering the first insulating layer and the second end of the light emitting element, a first bank disposed on a portion of the second electrode, and a second bank disposed on the first bank, and the first bank and the second bank include metal.

The first bank and the second bank may include a same material.

The second electrode may be electrically connected to the second end of the light emitting element.

The second electrode may include a convex portion partially extending in the longitudinal direction, and a flat portion extending in a first direction perpendicular to the longitudinal direction.

The convex portion may overlap a portion of the light emitting element and a portion of the first insulating layer, and the flat portion may overlap another portion of the first insulating layer.

The first bank may contact a portion of an upper surface of the second electrode and a side surface of the second electrode.

An upper surface of the first bank and the upper surface of the second electrode may have a same height in the longitudinal direction.

The first bank may directly contact the second electrode, and the first bank and the second electrode may have a same potential.

The second bank may directly contact the upper surface of the first bank and may at least partially overlap the first bank.

The display device may further include a first color conversion layer, a second color conversion layer, and a light scattering layer disposed on the upper surface of the second electrode, and the first color conversion layer, the second color conversion layer, and the light scattering layer each may convert light of different colors.

The display device may further include a second insulating layer adjacent to a side surface of the bonding electrode.

The display device may further include a third insulating layer adjacent to a side surface of the light emitting element.

The light emitting element may include a first semiconductor layer, an active layer disposed on the first semiconductor layer, and a second semiconductor layer disposed on the active layer.

According to an embodiment of the disclosure, a method of manufacturing a display device may include bonding a light emitting stack formed on a stack substrate to a bonding electrode layer formed on a pixel substrate, removing the stack substrate, forming light emitting elements and bonding electrodes on the pixel substrate by etching the light emitting stack and the bonding electrode layer, forming a first insulating layer to cover the light emitting elements and the pixel substrate, etching the first insulating layer to expose one ends of the light emitting elements, forming a common electrode to cover the etched first insulating layer and the one ends of the light emitting elements that are exposed, forming a bank layer on the common electrode, forming first banks by polishing the bank layer, forming photoresist patterns on a an upper surface of the common electrode, and forming second banks between the photoresist patterns.

The bank layer may include metal.

The first banks and the second banks may include a same material.

The forming of the first banks may include removing a portion of the bank layer such that upper surfaces of the first banks and the upper surface of the common electrode have a same height.

The method may further include forming a color conversion layer between the second banks by removing a portion of the photoresist patterns.

The method may further include forming a second insulating layer by oxidizing a surface of the bonding electrodes.

The method may further include forming a third insulating layer on side surfaces of the light emitting element or on side surfaces of the bonding electrodes.

According to an embodiment, the common electrode may be formed before the second bank, and the first banks may be formed on the common electrode. Accordingly, a degree of bonding between the light emitting elements and the bonding electrodes may be checked or inspected. Thus, a display device in which the light emitting elements and the bonding electrodes are stably bonded may be implemented.

According to an embodiment, since the first bank may include metal, the first bank and the common electrode may have a same potential, thus, a resistance inside a display element layer may be reduced and a voltage drop of the common electrode may be minimized.

According to an embodiment, the first bank may include metal having conductivity to easily diffuse heat inside the display element layer.

In addition, according to an embodiment, the first banks may be disposed between sub-pixels as a structure capable of partitioning each pixel area, thereby color cross talk between the sub-pixels may be prevented.

An effect according to an embodiment is not limited to contents exemplified above, and more various effects are included in the disclosure.

BRIEF DESCRIPTION OF THE DRAWINGS

The above and other features of the disclosure will become more apparent by describing in further detail embodiments thereof with reference to the accompanying drawings, in which.

DETAILED DESCRIPTION OF THE EMBODIMENT

Figure 1:
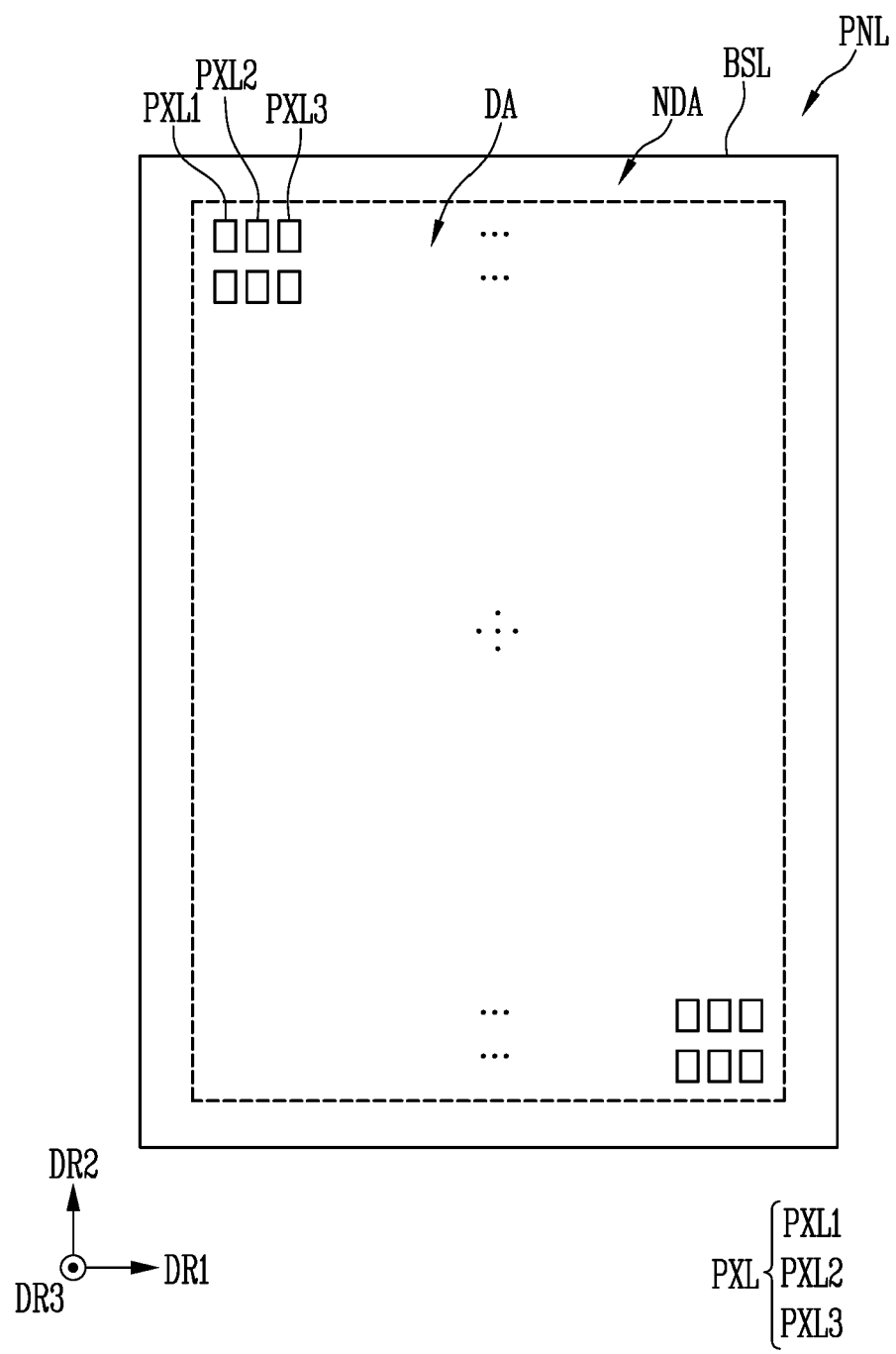
FIG. 1 is a schematic plan view illustrating a display panel of a display device according to an embodiment.

The disclosure may be variously modified and have various forms. Therefore, embodiments will be illustrated in the drawings and will be described in detail in the specification. However, it should be understood that the disclosure is not intended to be limited to the disclosed specific forms, and the disclosure includes all modifications, equivalents, and substitutions within the spirit and technical scope of the disclosure.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

It will be further understood that when the terms "comprises," "comprising," "includes" and/or "including", "have" and/or "having" are used in this specification, they or it may specify the presence of stated features, integers, steps, operations, elements and/or components, but do not preclude the presence or addition of other features, integers, steps, operations, elements, components, and/or any combination thereof.

Terms of "first", "second", and the like may be used to describe various components, but the components should not be limited by the terms. The terms are used only for the purpose of distinguishing one component from another component. For example, without departing from the scope of the disclosure, a first component may be referred to as a second component, and similarly, a second component may also be referred to as a first component. The singular expressions include plural expressions unless the context clearly indicates otherwise.

It should be understood that in the disclosure, a term of "include", "have", or the like is used to specify that there is a feature, a number, a step, an operation, a component, a part, or a combination thereof described in the specification, but does not exclude a possibility of the presence or addition of one or more other features, numbers, steps, operations, components, parts, or combinations thereof in advance. In addition, a case where a portion of a layer, a film, an area, a plate, or the like is referred to as being "on" another portion, it includes not only a case where the portion is "directly on" another portion, but also a case where there is further another portion between the portion and another portion. In addition, in the disclosure, when a portion of a layer, a film, an area, a plate, or the like is formed on another portion, a forming direction is not limited to an upper direction but includes forming the portion on a side surface or in a lower direction. On the contrary, when a portion of a layer, a film, an area, a plate, or the like is formed "under" another portion, this includes not only a case where the portion is "directly beneath" another portion but also a case where there is further another portion between the portion and another portion.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

In the drawings, sizes and thicknesses of elements may be enlarged for better understanding, clarity, and ease of description thereof. However, the disclosure is not limited to the illustrated sizes and thicknesses. In the drawings, the thicknesses of layers, films, panels, regions, and other elements, may be exaggerated for clarity. In the drawings, for better understanding and ease of description, the thicknesses of some layers and areas may be exaggerated.

Further, in the specification, the phrase "in a plan view" means when an object portion is viewed from above, and the phrase "in a schematic cross-sectional view" means when a schematic cross-section taken by vertically cutting an object portion is viewed from the side.

Additionally, the terms "overlap" or "overlapped" mean that a first object may be above or below or to a side of a second object, and vice versa. Additionally, the term "overlap" may include layer, stack, face or facing, extending over, covering or partly covering or any other suitable term as would be appreciated and understood by those of ordinary skill in the art. The terms "face" and "facing" mean that a first element may directly or indirectly oppose a second element. In a case in which a third element intervenes between the first and second element, the first and second element may be understood as being indirectly opposed to one another, although still facing each other. When an element is described as 'not overlapping' or 'to not overlap' another element, this may include that the elements are spaced apart from each other, offset from each other, or set aside from each other or any other suitable term as would be appreciated and understood by those of ordinary skill in the art.

When an embodiment may be implemented differently, a specific process order may be performed differently from the described order. For example, two consecutively described processes may be performed substantially at the same time or performed in an order opposite to the described order.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that when a layer, region, or element is referred to as being "connected to" or "coupled to" another layer, region, or element, it can be directly connected or coupled to the other layer, region, or element or intervening layers, regions, or elements may be present. For example, as used herein, when a layer, region, or element is referred to as being "electrically connected to" another layer, region, or element, it can be directly electrically connected to the other layer, region, or element or intervening layers, intervening regions, or intervening elements may be present.

Also, when an element is referred to as being "in contact" or "contacted" or the like to another element, the element may be in "electrical contact" or in "physical contact" with another element; or in "indirect contact" or in "direct contact" with another element.

Hereinafter, a display device according to an embodiment of the disclosure is described with reference to the drawings related to the embodiments of the disclosure.

FIG. 1 is a schematic plan view schematically illustrating a display panel PNL of a display device according to an embodiment.

Referring to FIG. 1, the display device according to an embodiment may include the display panel PNL including a base layer BSL and pixels PXL disposed on the base layer BSL.

The display panel PNL may be applied to a display portion of an electronic device in which a display surface is applied to at least one surface, such as a smartphone, a television, a tablet PC, a mobile phone, a video phone, an e-book reader, a desktop PC, a laptop PC, a netbook computer, a workstation, a server, a PDA, a portable multimedia player (PMP), an MP3 player, a medical device, a camera, an augmented reality (AR) glass, a virtual reality (VR) device, or a wearable display device.

In an embodiment, the display panel PNL may be implemented as a display panel of self-emission light such as an organic light emitting display panel (OLED panel), a micro or nano LED display panel, and a quantum dot organic light emitting display panel (QD OLED panel).

The base layer BSL may include a base member of the display device. According to an embodiment, the base layer BSL may be a rigid or flexible substrate or film, and a material or a physical property thereof is not limited thereto. For example, the base layer BSL may be a rigid substrate formed of glass or tempered glass, a flexible substrate (or a thin film) formed of plastic or metal, or may be formed of at least one insulating layer, and the material and/or the physical property thereof are/is not limited thereto.

The base layer BSL may include a display area DA displaying an image and a non-display area NDA adjacent to the display area DA. The non-display area NDA may be an area in which an image is not displayed, and may be a bezel area surrounding or adjacent to the display area DA.

The display area DA may be disposed on at least one surface of the display panel PNL. For example, the display area DA may be disposed on a front side of the display panel PNL, and may be disposed on a side surface and a rear surface of the display panel PNL.

The non-display area NDA may be disposed to surround or adjacent to the display area DA. The non-display area NDA may include lines, pads, a driving circuit, and the like connected to the pixels PXL of the display area DA.

The pixels PXL may be disposed in the display area DA. For example, the pixels PXL may be disposed in the display area DA in an arrangement such as a matrix or a stripe. However, the disclosure is not limited thereto.

Each of the pixels PXL may include a first sub-pixel PXL1, a second sub-pixel PXL2, and a third sub-pixel PXL3. The first to third sub-pixels PXL1, PXL2, and PXL3 may emit light of different colors, respectively.

Hereinafter, a light emitting element according to an embodiment is described with reference to FIGS. 2 and 3.

Figure 2:
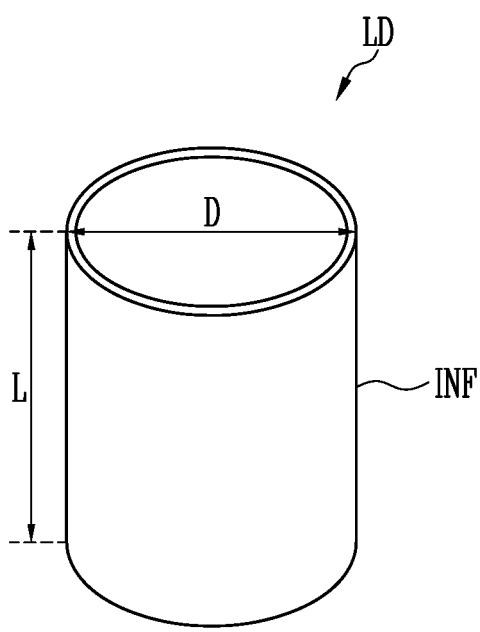
FIGS. 2 and 3 are perspective and cross-sectional views illustrating a light emitting element included in the display panel of FIG. 1.
Figure 3:
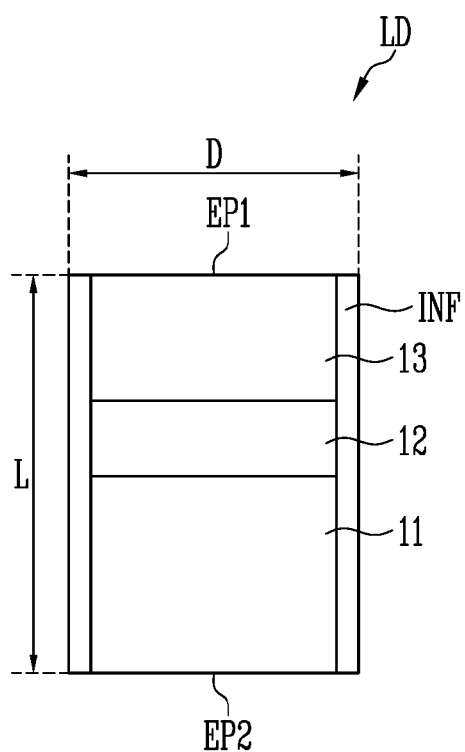

FIGS. 2 and 3 are schematic perspective and cross-sectional views illustrating a light emitting element LD included in the display panel PNL of FIG. 1.

Referring to FIGS. 2 and 3, the light emitting element LD may include a first semiconductor layer 11, an active layer 12, a second semiconductor layer 13, and an insulating layer INF. For example, the light emitting element LD may include a light emitting stack in which the first semiconductor layer 11, the active layer 12, and the second semiconductor layer 13 are sequentially stacked (see, e.g., FIG. 3).

The light emitting element LD may be in a column shape extending in one direction. The light emitting element LD may have one or an end (or a first end EP1) and another end (or a second end EP2) along the one direction. One of the first and second semiconductor layers 11 and 13 may be disposed at the first end EP1 of the light emitting element LD, and the other of the first and second semiconductor layers 11 and 13 may be disposed at the second end EP2 of the light emitting element LD.

The light emitting element LD may be manufactured in a column shape through an etching method or the like. In an embodiment, the column shape may include a rod-like shape or a bar-like shape having an aspect ratio greater than 1, such as a circular column or a polygonal column, however, a shape of a cross-section thereof is not limited thereto. In an embodiment, the end of the light emitting element LD may be implemented as a polygon such as a rectangle, a square, a regular triangle, or a regular pentagon, and may be implemented as a truncated pyramid shape in which an upper surface and a lower surface may be different from each other.

The light emitting element LD may have a size as small as a nanometer scale to a micrometer scale. For example, each of the light emitting elements LD may have a width D and/or a length L of a nanometer scale to micrometer scale range. However, the size of the light emitting element LD is not limited thereto, and the size of the light emitting element LD may be variously changed according to a design condition of various devices using a light emitting device that uses the light emitting element LD as a light source, for example, a display device or the like.

The first semiconductor layer 11 may include a first conductive (or type) semiconductor layer. For example, the first semiconductor layer 11 may include at least one n-type semiconductor. For example, the first semiconductor layer 11 may include a semiconductor material of any one of InAlGaN, GaN, AlGaN, InGaN, AlN, and InN, and may include an n-type semiconductor layer doped with a first conductive dopant such as Si, Ge, or Sn. However, the material of the first semiconductor layer 11 is not limited thereto, and the first semiconductor layer 11 may include various other materials.

The active layer 12 may be disposed on a surface of the first semiconductor layer 11. For example, the active layer 12 may be disposed on the first semiconductor layer 11. The active layer 12 may be formed in a single or multiple quantum well structure. In an embodiment, a clad layer (not shown) doped with a conductive dopant may be formed or disposed on and/or under (or below) the active layer 12. For example, the clad layer may be formed of an AlGaN layer or an InAlGaN layer. According to an embodiment, the active layer 12 may be formed of a material such as AlGaN or InAlGaN, and various other materials.

In a case that a voltage equal to or greater than a threshold voltage is applied to the upper surface and the lower surface of the light emitting element LD, the light emitting element LD may emit light while an electron-hole pair is combined in the active layer 12. Accordingly, light emission of the light emitting element LD may be controlled, thus, the light emitting element LD may be used as a light source of various light emitting devices.

The second semiconductor layer 13 may be disposed on a surface of the active layer 12. The second semiconductor layer 13 may be disposed on the active layer 12. The second semiconductor layer 13 may include a semiconductor layer of a conductivity (or type) different from that of the first semiconductor layer 11. For example, the second semiconductor layer 13 may include at least one p-type semiconductor layer. For example, the second semiconductor layer 13 may include at least one semiconductor material among InAlGaN, GaN, AlGaN, InGaN, AlN, and InN, and may include a p-type semiconductor layer doped with a second conductive dopant such as Mg, Zn, Ca, Sr, or Ba. However, the material of the second semiconductor layer 13 is not limited thereto.

Meanwhile, although each of the first semiconductor layer 11 and the second semiconductor layer 13 are shown as one layer, the disclosure is not limited thereto. In an embodiment, according to the material of the active layer 12, each of the first semiconductor layer 11 and the second semiconductor layer 13 may further include at least one or more layers, for example, a clad layer and/or a tensile strain barrier reducing (TSBR) layer. The TSBR layer may be a strain relief layer disposed between semiconductor layers having different lattice structures to serve as a buffer to reduce a lattice constant difference. The TSBR layer may be a p-type semiconductor layer such as p-GaInP, p-AlInP, or p-AlGaInP, but the disclosure is not limited thereto.

According to an embodiment, the light emitting element LD may further include an electrode (not shown) disposed on the surface of the first semiconductor layer 11 and/or the second semiconductor layer 13.

The electrode may be an ohmic contact electrode, but the disclosure is not limited thereto. According to an embodiment, the electrode may be a schottky contact electrode. The electrode may include a conductive material. For example, the electrode may include an opaque metal using chromium (Cr), titanium (Ti), aluminum (Al), gold (Au), nickel (Ni), an oxide or an alloy thereof, and the like alone or in combination thereof, but the disclosure is not limited thereto. According to an embodiment, the electrode may include transparent conductive oxide such as indium tin oxide (ITO), indium zinc oxide (IZO), zinc oxide (ZnO), indium gallium zinc oxide (IGZO), or indium tin zinc oxide (ITZO). The electrode may include a portion contacting (e.g., directly contact) an anode or a cathode.

The insulating layer INF may be adjacent to the light emitting stack and prevent an electrical short that may occur in a case that the active layer 12 comes into contact with a conductive material other than the first and second semiconductor layers 11 and 13. The insulating layer INF may minimize a surface defect of the light emitting element LD, accordingly, a lifespan and light emission efficiency of the light emitting element LD may be improved. In a case that the light emitting elements LD are closely disposed, the insulating layer INF may prevent an unwanted short between the light emitting elements LD. However, as long as the active layer 12 may prevent a short with an external conductive material, the insulating layer INF may be omitted.

The light emitting element LD may further include a reflective member (not shown) surrounding or adjacent to an outer circumferential surface of the insulating layer INF. The reflective member may be formed of a material having a predetermined reflectance such that light emitted from the light emitting element LD may be focused to a specific area while allowing the light to proceed in an image display direction (see, e.g., a third direction DR3 in FIG. 1). For example, the reflective member may be formed of a conductive material (or substance) having a predetermined reflectance.

Hereinafter, a display device and pixels according to an embodiment are described with reference to FIGS. 4 and 5.

Figure 4:
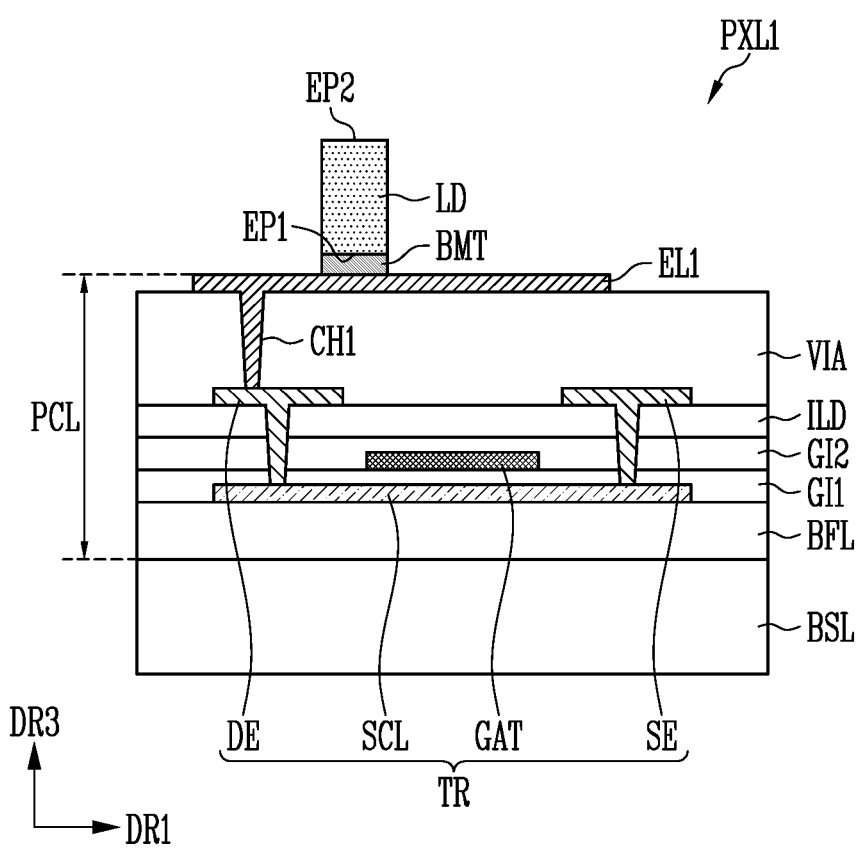
FIG. 4 is a schematic cross-sectional view schematically illustrating one pixel according to an embodiment.
Figure 5:
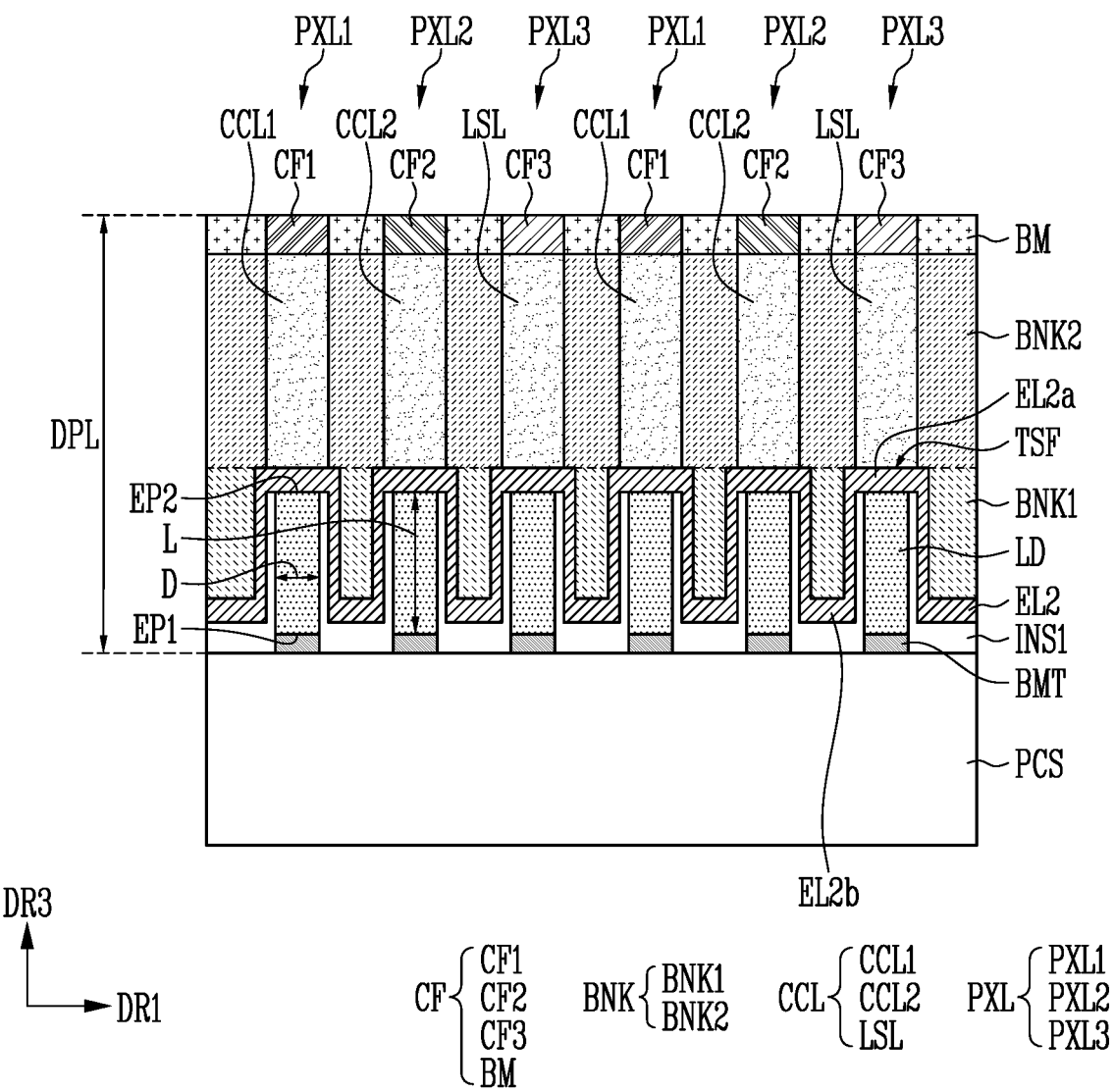
FIG. 5 is a schematic cross-sectional view schematically illustrating a plurality of pixels according to an embodiment.

FIG. 4 is a schematic cross-sectional view illustrating a first sub-pixel PXL1 according to an embodiment, and FIG. 5 is a schematic cross-sectional view illustrating pixels PXL according to an embodiment.

Referring to FIGS. 4 and 5, the first sub-pixel PXL1 included in the display device according to an embodiment may include a base layer BSL, a pixel circuit layer PCL, and a display element layer DPL.

The pixels PXL shown in FIG. 5 may include the first sub-pixel PXL1, a second sub-pixel PXL2, and a third sub-pixel PXL3 disposed in parallel in a first direction DR1 on a pixel substrate PCS. The pixel substrate PCS may refer to as a substrate including the base layer BSL and the pixel circuit layer PCL.

The base layer BSL may be a rigid or flexible substrate. For example, in the case that the base layer BSL is a rigid substrate, the base layer BSL may be implemented as a glass substrate, a quartz substrate, a glass ceramic substrate, a crystalline glass substrate, or the like. In the case that the base layer BSL is a flexible substrate, the base layer BSL may be implemented as a polymer organic substrate, a plastic substrate, or the like including polyimide, polyamide, or the like.

The pixel circuit layer PCL may be disposed on the base layer BSL.

The pixel circuit layer PCL may include a transistor TR and lines connected thereto. The pixel circuit layer PCL may include a buffer layer BFL, a first gate insulating layer GI1, a second gate insulating layer GI2, an interlayer insulating layer ILD, and a via layer VIA sequentially stacked on a surface of the base layer BSL. In an embodiment, the pixel circuit layer PCL may include a first electrode EL1. According to an embodiment, the first electrode EL1 may be included in the display element layer DPL.

The buffer layer BFL may be disposed on the base layer BSL to cover or overlap the base layer BSL. The buffer layer BFL may prevent an impurity from being diffused into the pixel circuit layer PCL from the outside. The buffer layer BFL may include at least one of a metal oxide such as silicon nitride ($SiN_x$), silicon oxide ($SiO_x$), silicon oxynitride ($SiO_xN_y$), and aluminum oxide ($AlO_x$). According to an embodiment, the buffer layer BFL may be omitted. In an embodiment, a lower metal layer (not shown) may be disposed between the base layer BSL and the buffer layer BFL.

The transistor TR may include a semiconductor pattern SCL, a gate electrode GAT, a source electrode SE, and a drain electrode DE. The transistor TR may be a driving transistor.

The semiconductor pattern SCL may be disposed on the buffer layer BFL. The semiconductor pattern SCL may include a channel region and a source region and a drain region disposed on both sides of the channel region. The source region of the semiconductor pattern SCL may be electrically connected to the source electrode SE, and the drain region may be electrically connected to the drain electrode DE. For example, the source region and the drain region may be expanded to be electrically connected to electrodes of different layers through contact holes, respectively.

The semiconductor pattern SCL may include at least one of polysilicon, amorphous silicon, and an oxide semiconductor.

The first gate insulating layer GI1 may be disposed on the semiconductor pattern SCL and the buffer layer BFL. The first gate insulating layer GI1 may cover or overlap the semiconductor pattern SCL and the buffer layer BFL.

The first gate insulating layer GI1 may include an inorganic material. For example, the first gate insulating layer GI1 may include at least one of silicon nitride ($SiN_x$), silicon oxide ($SiO_x$), silicon oxynitride ($SiO_xN_y$), and aluminum oxide ($AlO_x$). According to an embodiment, the first gate insulating layer GI1 may include an organic material.

The gate electrode GAT may be disposed on the first gate insulating layer GI1. The gate electrode GAT may be disposed to overlap the channel region of the semiconductor pattern SCL.

The second gate insulating layer GI2 may be disposed on the gate electrode GAT and the first gate insulating layer GI1. The second gate insulating layer GI2 may cover or overlap the gate electrode GAT and the first gate insulating layer GI1.

The second gate insulating layer GI2 may include a same material as the first gate insulating layer GI1. For example, the second gate insulating layer GI2 may include at least one of silicon nitride ($SiN_x$), silicon oxide ($SiO_x$), silicon oxynitride ($SiO_xN_y$), and aluminum oxide ($AlO_x$).

The interlayer insulating layer ILD may be disposed on the second gate insulating layer GI2. The interlayer insulating layer ILD may cover or overlap the second gate insulating layer GI2. The interlayer insulating layer ILD may include a same material as the second gate insulating layer GI2, and may include an inorganic material or an organic material.

The source electrode SE and the drain electrode DE may be disposed on the interlayer insulating layer ILD. The drain electrode DE may be electrically connected to the first electrode EL1 through a first contact hole CH1 that penetrates the via layer VIA, which will be described later. Accordingly, the transistor TR may transmit a driving voltage to the first electrode EL1.

The via layer VIA may be disposed on the interlayer insulating layer ILD. The via layer VIA may include at least one organic insulating layer. The via layer VIA may be formed of a single layer or multiple layers, and may include an inorganic insulating material or an organic insulating material. For example, the via layer VIA may include at least one of polyacrylates resin, epoxy resin, phenolic resin, polyamides resin, and polyimides resin.

The first electrode EL1 may be disposed on the via layer VIA. The first electrode EL1 may be electrically connected to the first end EP1 of each of the light emitting elements LD through a bonding electrode (bonding metal) BMT, which will be described later. The first electrode EL1 may be an anode.

The first electrode EL1 may include a transparent conductive material having a predetermined reflectance. For example, the first electrode EL1 may include a conductive oxide such as indium tin oxide (ITO), indium zinc oxide (IZO), zinc oxide (ZnO), indium gallium zinc oxide (IGZO), indium tin zinc oxide (ITZO), a conductive polymer such as poly(3,4-ethylenedioxythiophene) (PEDOT), or the like. The first electrode EL1 may include an opaque metal such that light emitted from the light emitting elements LD may be reflected in the display direction. For example, the first electrode EL1 may further include a metal such as magnesium (Mg), aluminum (Al), silver (Ag), gold (Au), copper (Cu), tin (Sn), platinum (Pt), palladium (Pd), nickel (Ni), neodymium (Nd), iridium (Ir), chromium (Cr), titanium (Ti), molybdenum (Mo), an alloy thereof, or the like.

As shown in FIG. 5, the display element layer DPL may include the bonding electrode BMT, the light emitting element LD, a first insulating layer INS1, a second electrode EL2, a first bank BNK1, a second bank BNK2, a color conversion layer CCL, and a color filter layer CF.

The bonding electrode BMT may be disposed on the first electrode EL1 and may include a portion bonded to the light emitting elements LD. The bonding electrode BMT may be electrically connected to the first electrode EL1.

The bonding electrode BMT may be disposed between the first electrode EL1 and the light emitting element LD, and may electrically connect the first electrode EL1 and the light emitting element LD. For example, the bonding electrode BMT may contact (e.g., directly contact) the first end EP1 of the light emitting element LD to electrically connect the first electrode EL1 and the first end EP1 of the light emitting element LD.

The bonding electrode BMT may be a reflective member for guiding the light emitted from the light emitting elements LD in the image display direction (e.g., the third direction DR3). For example, the bonding electrode BMT may be formed of an opaque conductive material having a predetermined reflectance. The bonding electrode BMT may include a same material as the first electrode EL1 or may include one or more materials selected from the materials of the first electrode ELL For example, the bonding electrode BMT may include a metal such as aluminum (Al), copper (Cu), gold (Au), tin (Sn), and an alloy thereof that may be bonded to the light emitting element LD.

The bonding electrode BMT of each of the first, second, and third sub-pixels PXL1, PXL2, and PXL3 may be spaced apart from each other in the first direction DR1.

The light emitting element LD may be disposed on the bonding electrode BMT. The first end EP1 of the light emitting element LD may be disposed on the bonding electrode BMT, and may be electrically connected to the bonding electrode BMT.

The first end EP1 of the light emitting element LD may face the bonding electrode BMT, and the second end EP2 of the light emitting element LD may face the second electrode EL2. For example, the second end EP2 of the light emitting element LD may be disposed opposite to the first end EP1 in the length L direction.

The light emitting element LD may be disposed in the length L direction of the light emitting element LD between the bonding electrode BMT and the second electrode EL2. The light emitting element LD shown in FIGS. 4 and 5 may correspond to the light emitting element LD of FIGS. 2 and 3 described above.

Although the width D of the light emitting element LD is shown to be substantially the same as a width of an upper surface of the bonding electrode BMT, the disclosure is not limited thereto. According to an embodiment, the width of the upper surface of the bonding electrode BMT may be wider than the width D of the light emitting element LD.

Each light emitting element LD of the first, second, and third sub-pixels PXL1, PXL2, and PXL3 may be disposed to be spaced apart from each other in the first direction DR1.

The first insulating layer INS1 may be disposed to cover or overlap, in a cross-sectional view, side surfaces of the light emitting element LD, side surfaces of the bonding electrode BMT, and the pixel circuit layer PCL. The first insulating layer INS1 may expose (e.g., not cover or not overlap) the second end EP2 of the light emitting element LD.

The first insulating layer INS1 may be disposed between the each light emitting element LD of the first, second, and third sub-pixels PXL1, PXL2, and PXL3.

The first insulating layer INS1 may include an inorganic material. According to an example, the first insulating layer INS1 may include at least one of silicon nitride (SiN$_x$), silicon oxide (SiO$_x$), silicon oxynitride (SiO$_x$N$_y$), and aluminum oxide (AlO$_x$). According to an embodiment, the first insulating layer INS1 may include an organic material.

The second electrode EL2 may be disposed on an entire surface of the display device. For example, the second electrode EL2 may be disposed on the light emitting element LD and the first insulating layer INS1 to cover or overlap the light emitting element LD and the first insulating layer INS1.

The second electrode EL2 may include a convex portion EL2a partially extending along in the third direction DR3 (or the length L direction) covering or overlapping the side surfaces of light emitting element LD, and a flat portion EL2b extending along the first direction DR1 (or a direction perpendicular to the length L direction) and covering or overlapping the first insulating layer INS1. The convex portion EL2a may cover or overlap a portion of the light emitting element LD and a portion of the first insulating layer INS1, and the flat portion EL2b may cover or overlap another portion of the first insulating layer INS1. The flat portion EL2b may be disposed between the each of the light emitting elements LD of the first, second, and third sub-pixels PXL1, PXL2, and PXL3. For example, a shape of the second electrode EL2 may correspond to a concavo-convex shape in which the convex portion EL2a and the flat portion EL2b continuously extend along the first direction DR1. However, the disclosure is not limited thereto, and the shape of the second electrode EL2 may be variously changed.

The second electrode EL2 may contact (e.g., directly contact) the second end EP2 of the light emitting element LD. The second electrode EL2 may be electrically connected to the second end EP2 of the light emitting element LD. The second electrode EL2 may be a cathode. Accordingly, the second electrode EL2 may transmit a driving low voltage provided from the outside to the second end EP2 of the light emitting element LD.

The second electrode EL2 may include a transparent conductive material having a predetermined reflectance. For example, the second electrode EL2 may include a conductive oxide such as indium tin oxide (ITO), indium zinc oxide (IZO), zinc oxide (ZnO), indium gallium zinc oxide (IGZO), indium tin zinc oxide (ITZO), a conductive polymer such as poly(3,4-ethylenedioxythiophene) (PEDOT), or the like. However, the material of the second electrode EL2 is not limited thereto.

The first bank BNK1 may be disposed on a portion of the second electrode EL2. The first bank BNK1 may, in a cross-sectional view, contact (e.g., directly contact) a portion of the upper surface of the second electrode EL2 and side surfaces of the second electrode EL2. The first bank BNK1 may contact (e.g., directly contact) the side surfaces of the second electrodes EL2 disposed to be spaced apart from each other in the first direction DR1. Accordingly, a cross-section of the first bank BNK1 may correspond to a long rectangular shape along the third direction DR3. The disclosure is not limited thereto, and a shape of the first bank BNK1 may be variously changed according to an embodiment.

An upper surface of the first bank BNK1 and the upper surface TSF of the second electrode EL2 may a same height. Accordingly, the upper surface of the first bank BNK1 and the upper surface TSF of the second electrode EL2 may be flat.

The first bank BNK1 may contact (e.g., directly contact) the second electrode EL2 and may have a same potential as the second electrode EL2. Accordingly, the first bank BNK1 may decrease a resistance inside the display element layer DPL, thereby a voltage drop (IR drop) of the second electrode EL2 may be minimized.

The first bank BNK1 may include a metal material. For example, the first bank BNK1 may include an electrolyte, an electroplating material, and the like.

In an embodiment, since the first bank BNK1 may include a metal material having conductivity, heat inside the display element layer DPL may be easily diffused.

The first bank BNK1 may include a conductive material having a predetermined reflectance. Accordingly, the first bank BNK1 may be used a reflective member that guides the light emitted from the light emitting elements LD in the image display direction.

The first bank BNK1 may be disposed between the first, second, and third sub-pixels PXL1, PXL2 and PXL3 as a structure capable of partitioning each pixel area, accordingly, color crosstalk between the first, second, and third sub-pixels PXL1, PXL2 and PXL3 may be prevented. First banks BNK1 may be disposed to be spaced apart from each other in the first direction DR1.

Second banks BNK2 may be disposed on the first bank BNK1. The second banks BNK2 may be disposed to be spaced apart from each other in the first direction DR1.

The second bank BNK2 may include a same material as the first bank BNK1. Accordingly, the first bank BNK1 and the second bank BNK2 may form a bank BNK and may be a structure capable of partitioning each pixel area. The second electrode EL2 may be formed before the second bank BNK2, and the first bank BNK1 may be formed or disposed on the second electrode EL2. Accordingly, a bonding degree between the light emitting element LD and the bonding electrode BMT may be checked or inspected. Accordingly, the light emitting element LD and the bonding electrode BMT may be stably bonded in the display device.

The color conversion layer CCL may be disposed on the second electrode EL2 and may be disposed between the second banks BNK2. For example, the color conversion layer CCL may be disposed between the second banks BNK2.

The color conversion layer CCL may convert the light emitted from the light emitting element LD, and may include a color conversion particle (for example, a quantum dot) corresponding to a predetermined color to convert the light generated by the light emitting element LD. The color conversion layer CCL may selectively transmit and convert the light emitted from the light emitting element LD together with a color filter layer CF.

The color conversion layer CCL may include a first color conversion layer CCL1, a second color conversion layer CCL2, and a light scattering layer LSL spaced apart from each other along the first direction DR1 with the second bank BNK2 interposed therebetween.

The first color conversion layer CCL1, the second color conversion layer CCL2, and the light scattering layer LSL may be disposed on the upper surface TSF of the second electrode EL2.

The first color conversion layer CCL1 may be disposed on the second electrode EL2 of the first sub-pixel PXL1 and overlap the light emitting element LD. The first color conversion layer CCL1 may include a red quantum particle (not shown) that converts blue light emitted from the light emitting element LD into red light. The red quantum particle may absorb the blue light and shift a wavelength according to an energy transition to emit the red light of a wavelength band of about 620 nm to about 780 nm.

The second color conversion layer CCL2 may be disposed on the second electrode EL2 of the second sub-pixel PXL2 and overlap the light emitting element LD. The second color conversion layer CCL2 may include a green quantum particle (not shown) that converts the blue light emitted from the light emitting element LD into green light. The green quantum particle may absorb the blue light and shift the wavelength according to the energy transition to emit the green light of a wavelength band of about 500 nm to about 570 nm.

The light scattering layer LSL may be disposed on the second electrode EL2 of the third sub-pixel PXL3 and overlap the light emitting element LD. The light scattering layer LSL may include light scattering particles, and the light scattering particles may be titanium oxide ($TixO_y$) including titanium dioxide ($TiO_2$), silica, or the like.

The color filter layer CF may be disposed on the color conversion layer CCL and the second bank BNK2.

The color filter layer CF may include a first color filter CF1, a second color filter CF2, a third color filter CF3, and a light blocking member BM.

The first color filter CF1 may be disposed on the first color conversion layer CCL1. The first color filter CF1 may include a color filter material that selectively transmits light generated in the first sub-pixel PXL1. For example, in a case that the first sub-pixel PXL1 is a red pixel, the first color filter CF1 may include a red color filter material.

The second color filter CF2 may be disposed on the second color conversion layer CCL2. The second color filter CF2 may include a color filter material that selectively transmits light generated in the second sub-pixel PXL2. For example, in a case that the second sub-pixel PXL2 is a green pixel, the second color filter CF2 may include a green color filter material.

The third color filter CF3 may be disposed on the light scattering layer LSL. The third color filter CF3 may include a color filter material that selectively transmits light generated in the third sub-pixel PXL3. For example, in a case that the third sub-pixel PXL3 is a blue pixel, the third color filter CF3 may include a blue color filter material.

The light blocking member BM may be disposed on the second bank BNK2. The light blocking member BM may be disposed between the first, second, and third color filters CF1, CF2, and CF3 in the first direction DR1.

The light blocking member BM may include at least a black matrix material (e.g., at least one known light blocking material) among various types of black matrix materials, a color filter material of a specific color, and the like.

According to an embodiment, the light blocking member BM may include an overlap color filter. The overlap color filter may be formed by extending at least two of the first color filter CF1, the second color filter CF2, and the third color filter CF3 on the second bank BNK2. Accordingly, the overlap color filter may serve as a black matrix blocking light.

Hereinafter, a method of manufacturing a display device according to an embodiment is described with reference to FIGS. 6 to 15.

FIGS. 6 to 15 are cross-sectional views sequentially illustrating a method of manufacturing a display device according to an embodiment.

Figure 6:
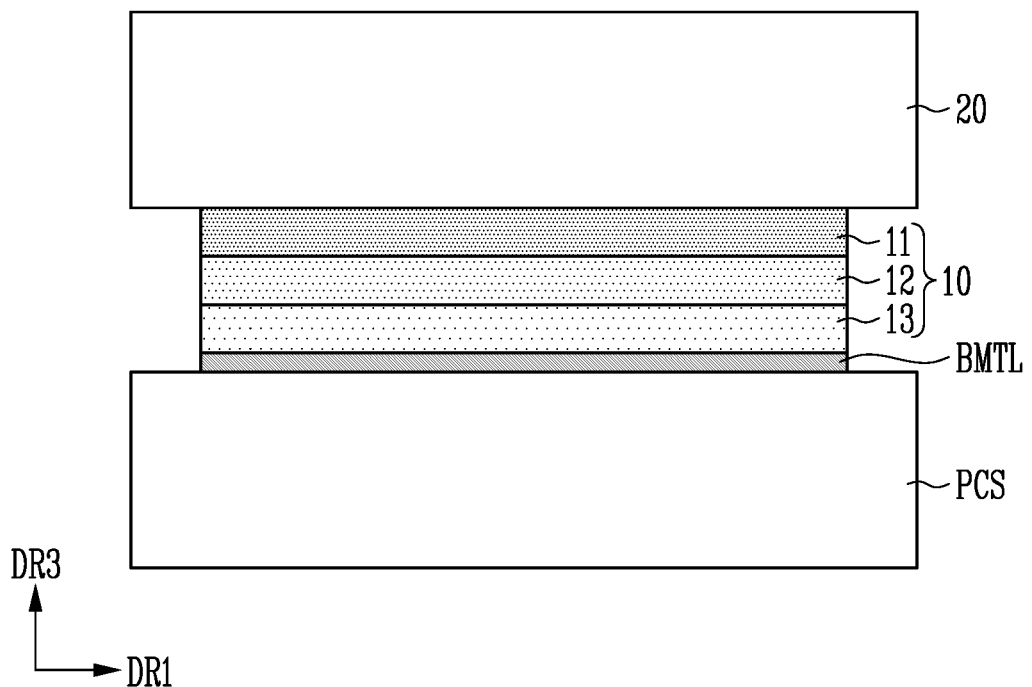
FIGS. 6 to 15 are schematic cross-sectional views sequentially illustrating a method of manufacturing a display device according to an embodiment.

Referring to FIG. 6, the light emitting stack 10 formed or disposed on the stack substrate 20 may be bonded to a bonding electrode layer BMTL formed or disposed on the pixel substrate PCS. The pixel substrate PCS may be the substrate including the base layer BSL and the pixel circuit layer PCL described with reference to FIGS. 4 and 5.

The stack substrate 20 may be a base substrate for stacking materials. The stack substrate 20 may be a wafer for epitaxial growth of a predetermined material. According to an example, the stack substrate 20 may be any one of a sapphire substrate, a GaAs substrate, a Ga substrate, and an InP substrate, but the disclosure is not limited thereto.

The light emitting stack 10 may include the first semiconductor layer 11, the active layer 12, and the second semiconductor layer 13 sequentially formed on or disposed below the stack substrate 20. The first semiconductor layer 11, the active layer 12, and the second semiconductor layer 13 may be sequentially disposed or stacked in the third direction DR3. The second semiconductor layer 13 may be disposed to face the bonding electrode layer BMTL such that the second semiconductor layer 13 may contact (e.g., directly contact) and bond to the bonding electrode layer BMTL. The disclosure is not limited thereto, and the first semiconductor layer 11 may be disposed to face the bonding electrode layer BMTL such that the first semiconductor layer 11 may contact (e.g., directly contact) and bond to the bonding electrode layer BMTL.

Figure 7:
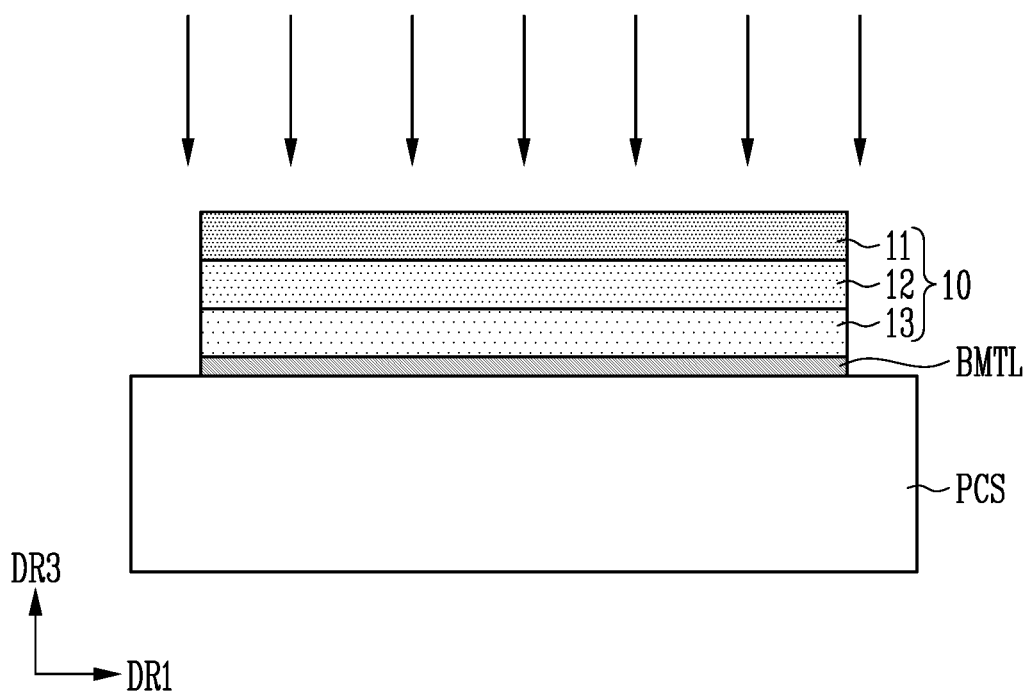
Figure 8:
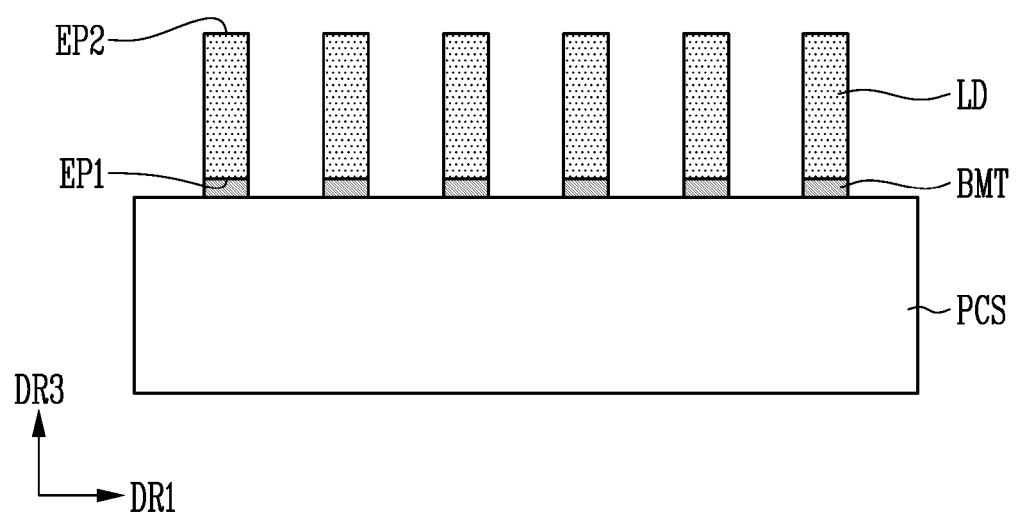

Referring to FIGS. 7 and 8, the stack substrate 20 may be removed, and the light emitting element LD and the bonding electrode BMT may be formed or disposed on the pixel substrate PCS through an etching process.

As shown in FIG. 8, the length L direction of the light emitting element LD may correspond to the third direction DR3, and the first end EP1 of the light emitting element LD may contact (e.g., directly contact) the bonding electrode BMT.

Each set of light emitting elements LD and bonding electrodes BMT may be formed to be spaced apart from each other in the first direction DR1.

In order to form the light emitting element LD and the bonding electrode BMT, a photosensitive material may be coated or disposed on the light emitting stack 10, and then a photoresist process and an etching process may be performed. A dry etching method may be applied to the etching process. According to an example, the dry etching method may be any one of reactive ion etching (RIE), reactive ion beam etching (RIBE), and inductively coupled plasma reactive ion etching (ICP-RIE), but the disclosure is not limited thereto.

Figure 9:
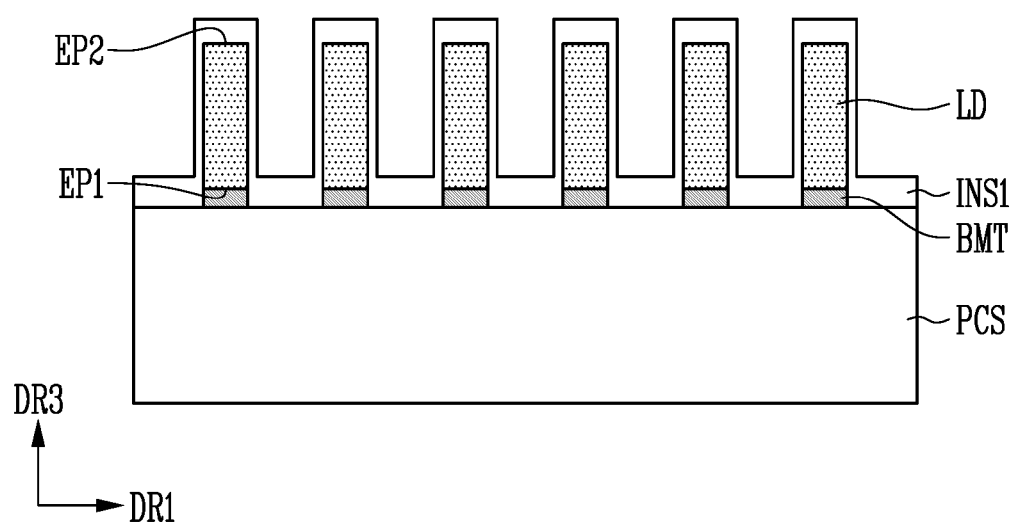

Referring to FIG. 9, the first insulating layer INS1 may be formed to cover or overlap the light emitting element LD and the pixel substrate PCS The first insulating layer INS1 may be formed to cover or overlap a portion of the pixel substrate PCS, the side surfaces of the bonding electrode BMT, the side surfaces of the light emitting element LD, and the second end EP2 of the light emitting element LD. A lower portion of the first insulating layer INS1 contacting (e.g., directly contacting) the pixel substrate PCS may correspond to a gap (or a space) between the light emitting elements LD spaced apart from each other in the first direction DR1.

The first insulating layer INS1 may be an inorganic material including at least one of silicon nitride ($SiN_x$), silicon oxide ($SiO_x$), silicon oxynitride ($SiO_xN_y$), and aluminum oxide ($AlO_x$). According to an embodiment, the first insulating layer INS1 may include an organic material.

Figure 10:
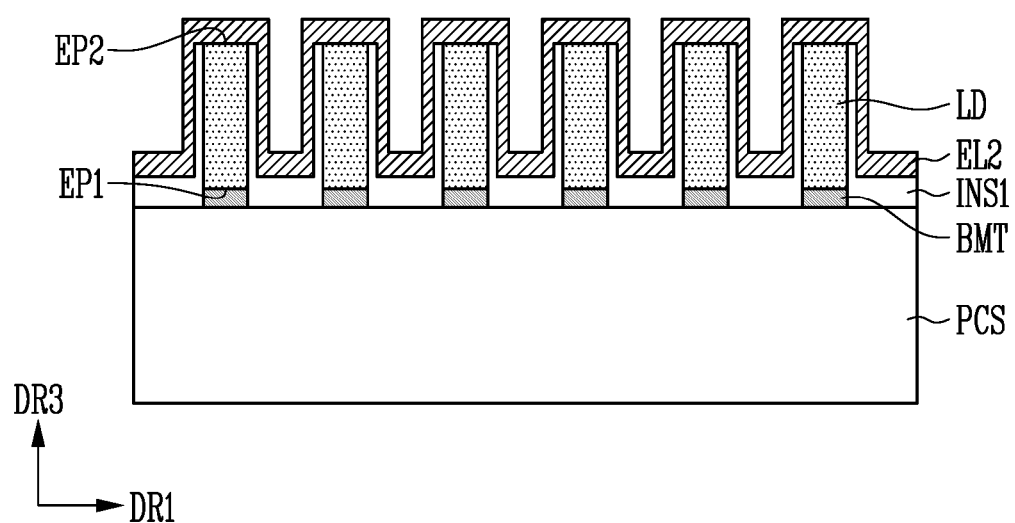

Referring to FIG. 10, the first insulating layer INS1 may be etched to expose the second end EP2 of the light emitting element LD. The second electrode EL2 (or the common electrode) may be formed to cover or overlap the first insulating layer INS1 and the second end EP2 of the light emitting element LD.

The second electrode EL2 may be formed or disposed on the entire surface of the display device. For example, the second electrode EL2 may be formed to cover or overlap the lower portion of the first insulating layer INS1, the side surfaces of the first insulating layer INS1, and the second end EP2 of the light emitting element LD. A portion of the second electrode EL2 covering or overlapping the lower portion of the first insulating layer INS1 and the side surfaces of the first insulating layer INS1 may correspond to the space between the light emitting elements LD.

Figure 11:
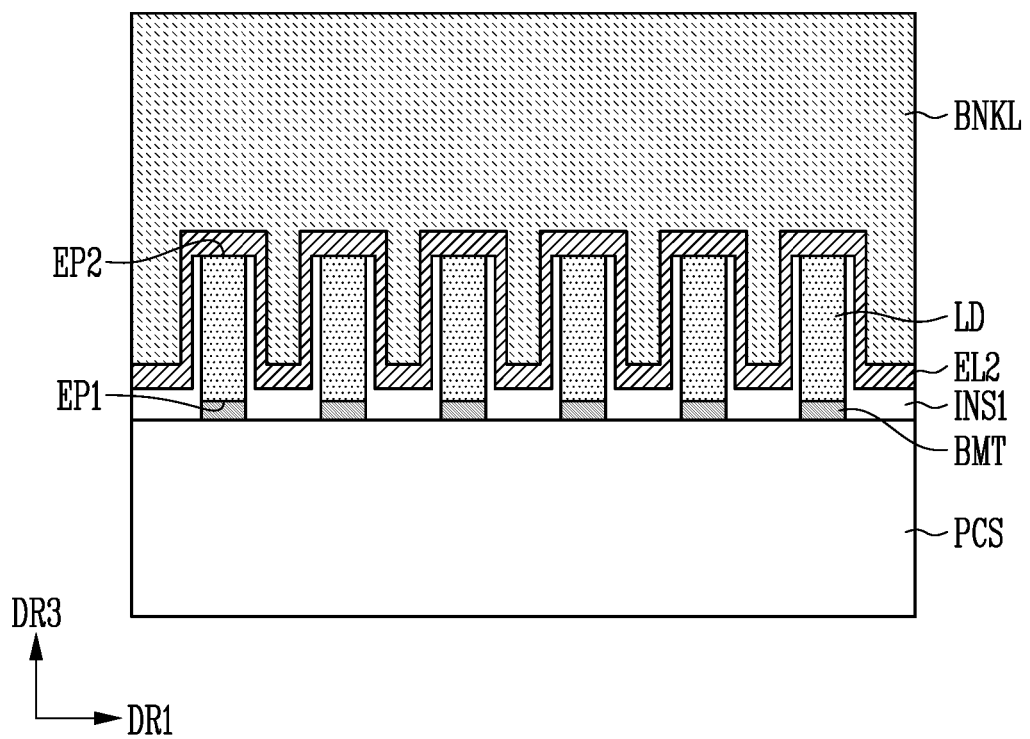

Referring to FIG. 11, a bank layer BNKL may be formed on the second electrode EL2.

The bank layer BNKL may be formed to cover or overlap the entire surface of the display device. For example, the bank layer BNKL may contact (e.g., directly contact) an upper surface of the second electrode EL2, and may be formed in the space between the light emitting elements LD.

The bank layer BNKL may include a metal material. For example, the first bank BNK1 may include an electrolyte, an electroplating material, and the like, and may include a metal material having conductivity.

Figure 12:
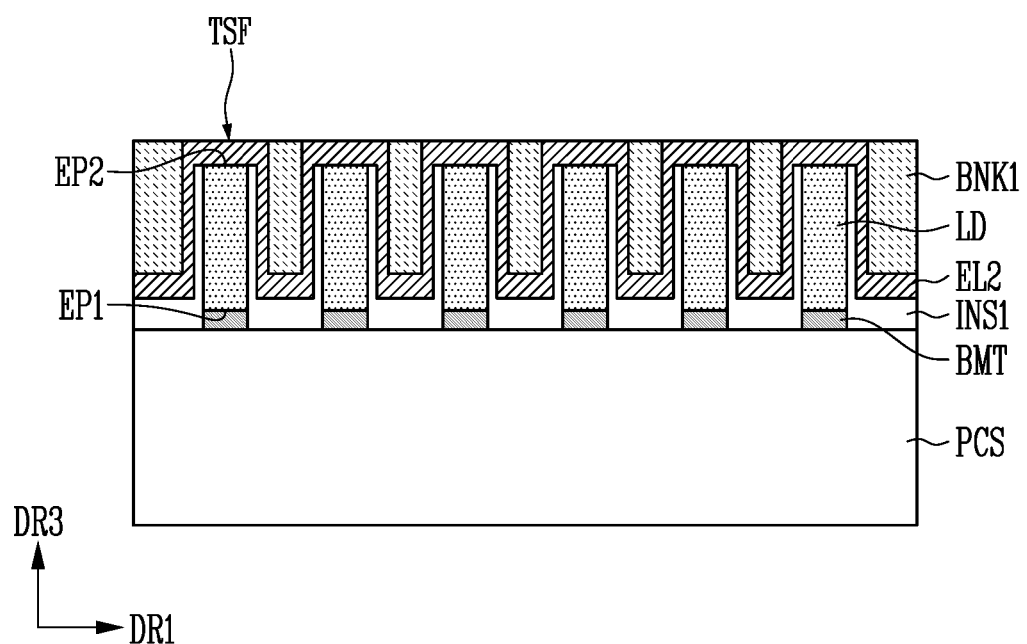

Referring to FIG. 12, the first bank BNK1 may be formed by removing (e.g., polishing) a portion of the bank layer BNKL.

The portion of the bank layer BNKL may be removed such that an upper surface of the bank layer BNKL and the upper surface TSF of the second electrode EL2 may have a same height through a polishing process. Accordingly, the upper surface of the first bank BNK1 and the upper surface TSF of the second electrode EL2 may have a same height in the third direction DR3. The first bank BNK1 may be formed or disposed in the space between the light emitting elements LD. In the space between the light emitting elements LD, the first bank BNK1 may contact (e.g., directly contact) the upper surface of the second electrode EL2 and the side surfaces of the second electrode EL2.

The bank layer BNKL may be planarized to expose the upper surface TSF of the second electrode EL2 through a chemical mechanical polishing (CMP) process. The upper surface TSF of the second electrode EL2 may be highest surface among surfaces of the second electrode EL2 in the third direction DR3.

Figure 13:
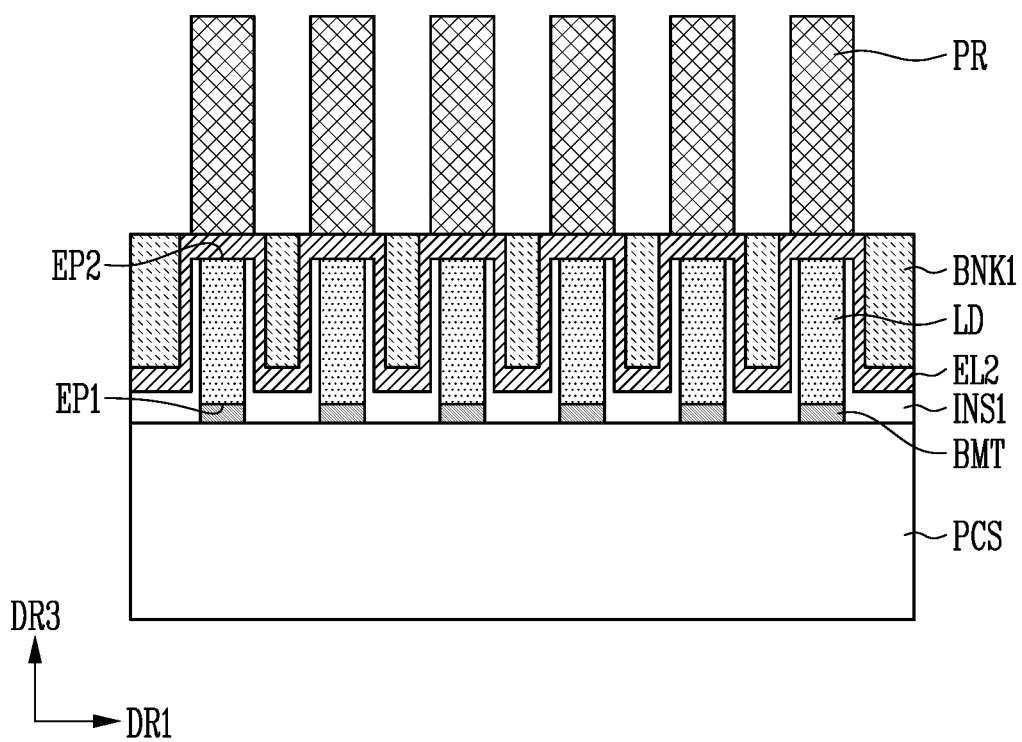
Figure 14:
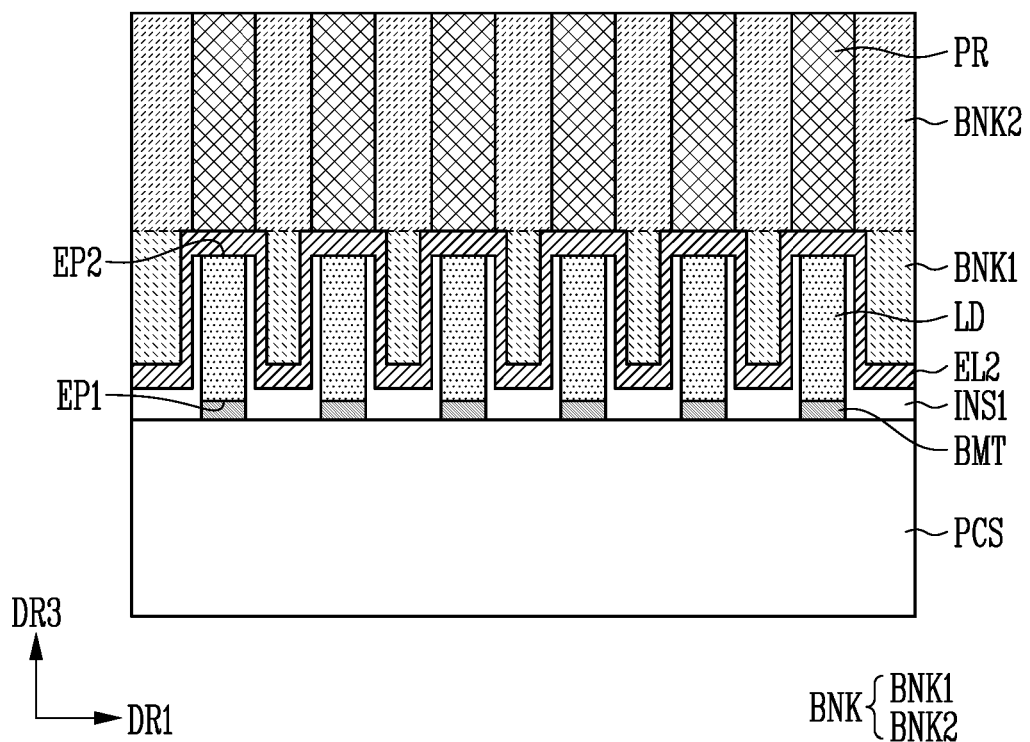

Referring to FIGS. 13 and 14, photoresist patterns PR may be formed on the upper surface TSF of the second electrode EL2, and the second bank BNK2 may be formed between the photoresist patterns PR.

The photoresist patterns PR may be formed to be elongated in the third direction DR3, and the second bank BNK2 may be formed between the photoresist patterns PR in the first direction DR1. For example, the second bank BNK2 may be formed on the first bank BNK1.

The second bank BNK2 may include a same material as the first bank BNK1. Accordingly, the bank BNK may include the first bank BNK1 and the second bank BNK2 and may be a structure capable of partitioning each pixel area.

In an embodiment, the second electrode EL2 may be formed before the second bank BNK2, and the first bank BNK1 may be formed on the second electrode EL2. Accordingly, a bonding degree between the light emitting element LD and the bonding electrode BMT may be checked or inspected. Accordingly, the light emitting element LD and the bonding electrode BMT may be stably bonded in the display device.

Figure 15:
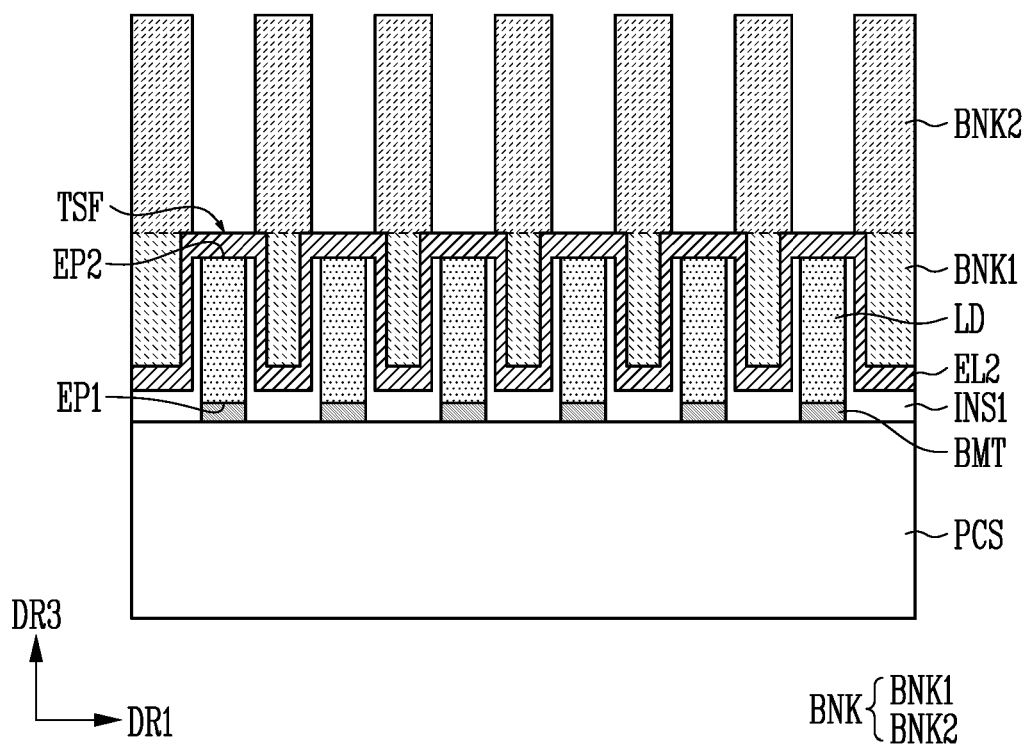

Referring to FIG. 15, a space for forming the color conversion layer CCL between the second banks BNK2 may be formed by removing the photoresist patterns PR.

Referring to FIG. 5 described above, the color conversion layer CCL may be formed between the second banks BNK2 in the first direction DR1. Thereafter, the first, second, and third color filters CF1, CF2, and CF3 and the light blocking member BM may be formed.

Hereinafter, a display device and a method of manufacturing the display device according to an embodiment are described with reference to FIGS. 16 and 17.

Figure 16:
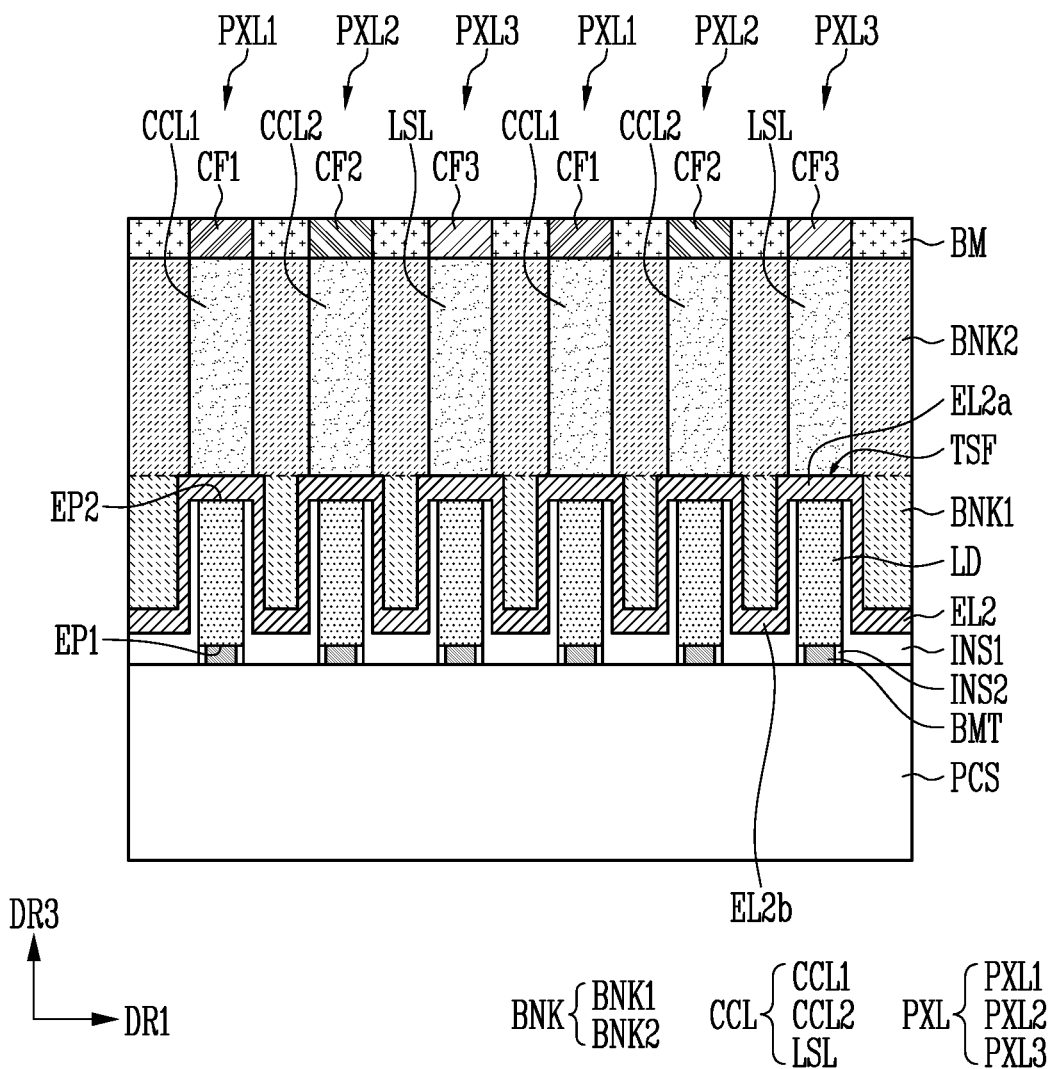
FIG. 16 is a schematic cross-sectional view schematically illustrating a plurality of pixels according to an embodiment.
Figure 17:
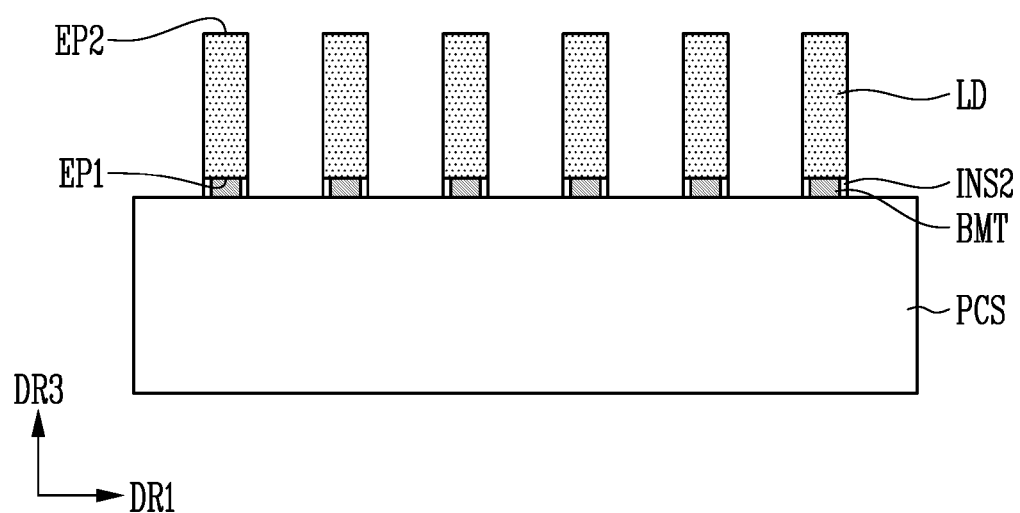
FIG. 17 is a schematic cross-sectional view illustrating one process of a method of manufacturing a display device according to an embodiment.

FIG. 16 is a schematic cross-sectional view illustrating pixels PXL according to an embodiment, and FIG. 17 is a schematic cross-sectional view illustrating a method of manufacturing a display device according to an embodiment.

Referring to FIG. 16, the pixels PXL in the display device according to the embodiment may include the first sub-pixel PXL1, the second sub-pixel PXL2, and the third sub-pixel PXL3 disposed in parallel in the first direction DR1 on the pixel substrate PCS. Since FIG. 16 is similar to FIG. 5 described above, hereinafter, in order to prevent a repetitive description, the disclosure is described based on a difference from FIG. 5.

The pixel PXL according to an embodiment may further include a second insulating layer INS2.

The second insulating layer INS2 may be disposed on the side surfaces of the bonding electrode BMT. For example, the second insulating layer INS2 may be disposed to surround or adjacent to the side surface of the bonding electrode BMT.

The second insulating layer INS2 may include an oxide insulating layer. For example, the second insulating layer INS2 may include a metal oxide of a metal such as aluminum (Al), copper (Cu), gold (Au), tin (Sn), and an alloy thereof. The disclosure is not limited thereto. For example, the second insulating layer INS2 may include a metal oxide in which a metal material forming the bonding electrode BMT may be oxidized.

Referring to FIGS. 8, 9, and 16 described above and FIG. 17, the light emitting element LD and the bonding electrode BMT may be formed or disposed on the pixel substrate PCS, and the second insulating layer INS2 may be formed by oxidizing a surface of the light emitting element LD and/or the bonding electrode BMT. Thereafter, the first insulating layer INS1 may be formed to cover or overlap the light emitting element LD, the second insulating layer INS2, and the pixel substrate PCS.

The first insulating layer INS1 may be formed to, in a cross-sectional view, cover or contact (e.g., directly contact) a portion of the pixel substrate PCS, side surfaces of the second insulating layer INS2, the side surfaces of the light emitting element LD, and the second end EP2 of the light emitting element LD.

In FIG. 17, the second insulating layer INS2 may formed on the side surfaces of the bonding electrode BMT, but the second insulating layer INS2 may also be formed on the side surfaces of the light emitting element LD according to an embodiment. For example, the second insulating layer INS2 may formed only on the side surfaces of the bonding electrode BMT, but the second insulating layer INS2 may also be formed on the side surfaces of the light emitting element LD.

The display device shown in FIG. 16 may be manufactured by sequentially performing the manufacturing method of FIGS. 10 to 15.

In an embodiment, the second electrode EL2 may be formed before the second bank BNK2, and the first bank BNK1 may be formed or disposed on the second electrode EL2. Accordingly, a bonding degree between the light emitting element LD and the bonding electrode BMT may be checked or inspected. Accordingly, the light emitting element LD and the bonding electrode BMT may be stably bonded in the display device.

Hereinafter, a display device and a method of manufacturing the display device according to an embodiment are described with reference to FIGS. 18 and 19.

Figure 18:
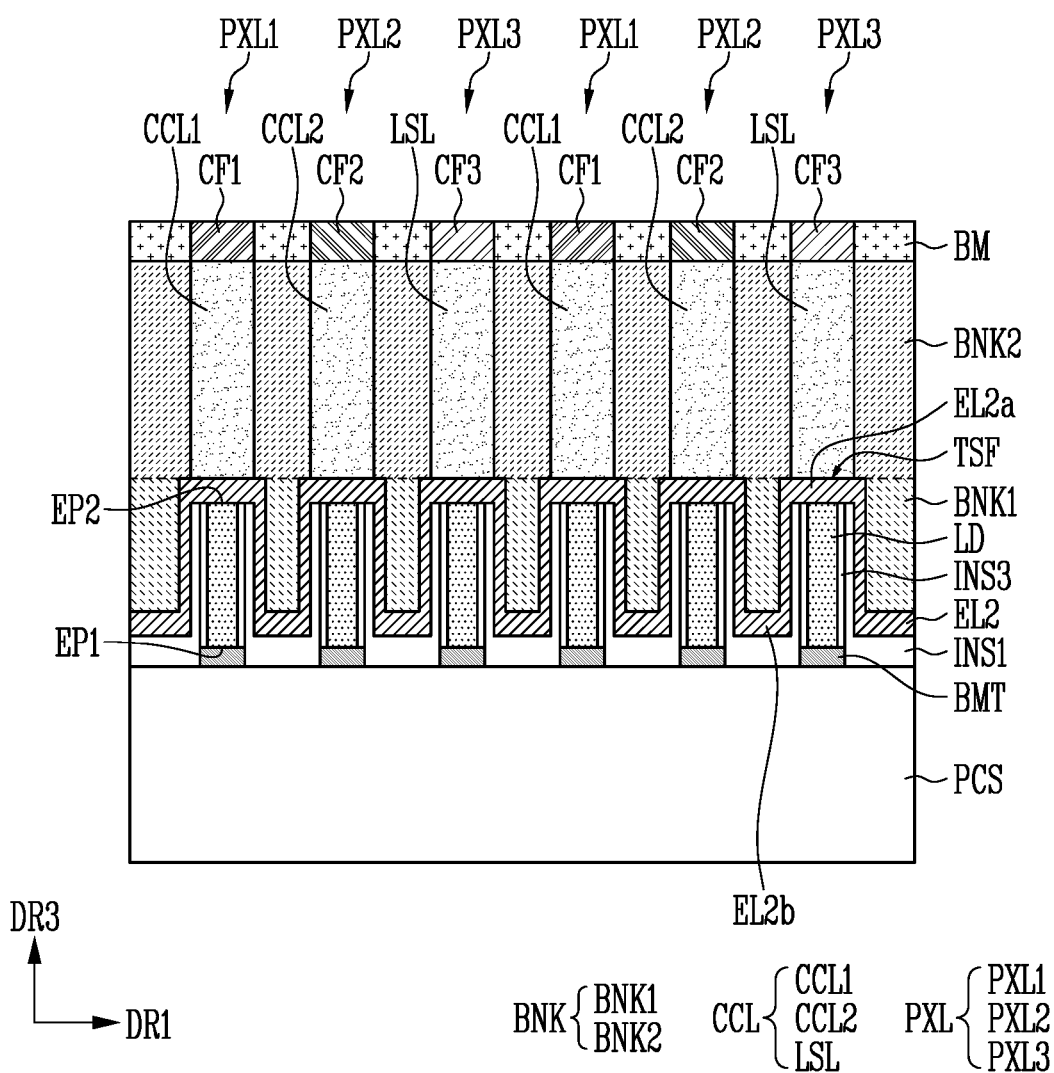
FIG. 18 is a schematic cross-sectional view schematically illustrating a plurality of pixels according to an embodiment.
Figure 19:
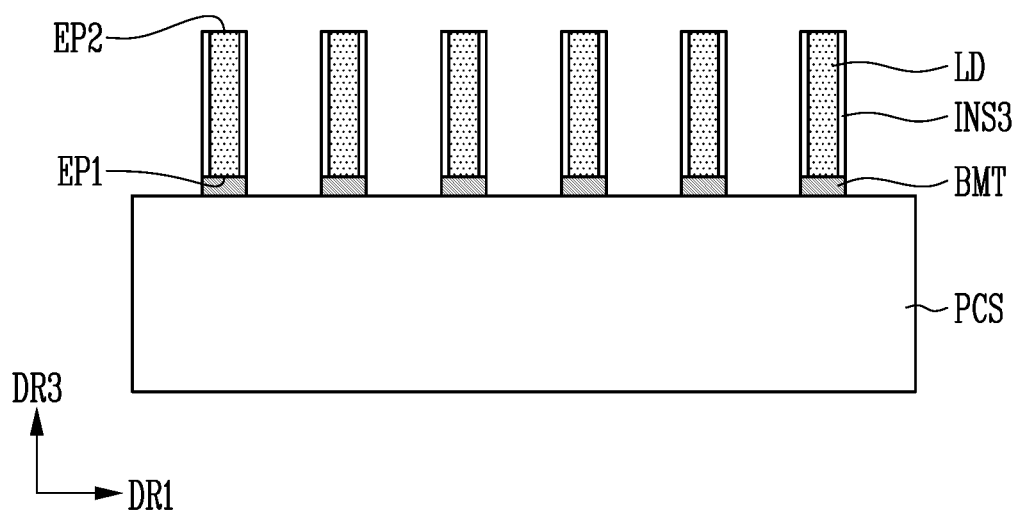
FIG. 19 is a schematic cross-sectional view illustrating one process of a method of manufacturing a display device according to an embodiment.

FIG. 18 is a schematic cross-sectional view illustrating a plurality of pixels PXL according to an embodiment, and FIG. 19 is a schematic cross-sectional view illustrating a method of manufacturing a display device according to an embodiment.

Referring to FIG. 18, the pixels PXL included in the display device according to the embodiment may include the first sub-pixel PXL1, the second sub-pixel PXL2, and the third sub-pixel PXL3 disposed in parallel in the first direction DR1 on the pixel substrate PCS. Since FIG. 18 is similar to FIG. 5 described above, hereinafter, in order to prevent a repetitive description, the disclosure is described based on a difference from FIG. 5.

The pixel PXL according to an embodiment may further include a third insulating layer INS3.

The third insulating layer INS3 may be disposed on the side surfaces of the light emitting element LD. For example, the third insulating layer INS3 may be disposed to surround or adjacent to the side surface of the light emitting element LD.

The third insulating layer INS3 may include an oxide insulating layer. For example, the third insulating layer INS3 may include a metal oxide of a metal such as aluminum (Al), copper (Cu), gold (Au), tin (Sn), and an alloy thereof. This is an example, and the disclosure is not limited thereto.

The third insulating layer INS3 may include an inorganic material including silicon oxide ($SiO_x$), silicon oxynitride ($SiO_xN_y$), aluminum oxide ($AlO_x$), and the like.

Referring to FIGS. 8, 9, and 18 described above and FIG. 19, the light emitting element LD and the bonding electrode BMT may be formed or disposed on the pixel substrate PCS, and the third insulating layer INS3 may be formed or disposed on a surface of the light emitting element LD. The first insulating layer INS1 may be formed to cover or overlap the light emitting element LD, the third insulating layer INS3, and the pixel substrate PCS.

The first insulating layer INS1 may be formed to, in a cross-sectional view, cover or contact (e.g., directly contact) the portion of the pixel substrate PCS, the side surfaces of the bonding electrode BMT, side surfaces of the third insulating layer INS3, and the second end EP2 of the light emitting element LD.

The display device shown in FIG. 18 may be manufactured by sequentially performing the manufacturing method of FIGS. 10 to 15.

In an embodiment, the second electrode EL2 may be formed before the second bank BNK2, and the first bank BNK1 may be formed or disposed on the second electrode EL2. Accordingly, a bonding degree between the light emitting element LD and the bonding electrode BMT may be checked or inspected. Accordingly, the light emitting element LD and the bonding electrode BMT may be stably bonded in the display device.

Hereinafter, various embodiments to which a display panel according to an embodiment may be applied are described with reference to FIGS. 20 and 21.

Figure 20:
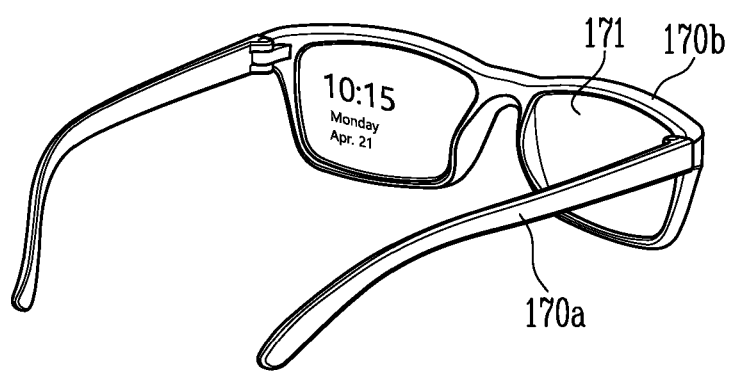
FIG. 20 is a diagram illustrating a display device according to an embodiment applied to a smart glass.
Figure 21:
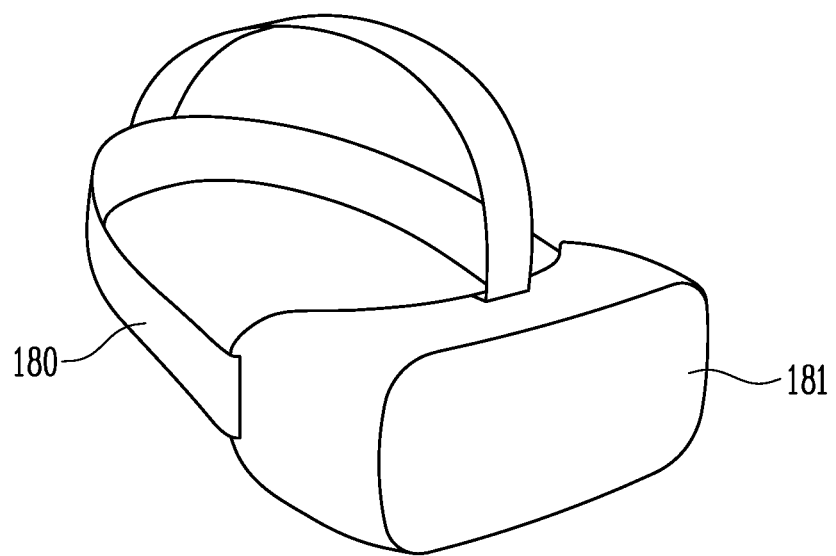
FIG. 21 is a diagram illustrating a display device according to an embodiment applied to a VR device.

FIG. 20 is a schematic diagram illustrating a display device according to an embodiment applied to a smart glass, and FIG. 21 is a schematic diagram illustrating a display device according to an embodiment applied to a VR device.

Referring to FIG. 20, the display device according to an embodiment may be applied to a smart glass including a frame 170 and a lens unit 171. The smart glass may be a wearable electronic device that may be worn on a face of a user, and may have a structure in which a portion of the frame 170 may be folded or unfolded. For example, the smart glass may be a wearable device for augmented reality (AR).

The frame 170 may include a housing 170b supporting the lens unit 171 and a leg unit 170a for wearing of the user. The leg unit 170a may be connected to the housing 170b by a hinge and may be folded or unfolded.

The frame 170 may include a battery, a touch pad, a microphone, a camera, and the like therein. In addition, the frame 170 may include a projector that outputs light, a processor that controls a light signal or the like, and the like therein.

The lens unit 171 may be an optical member that transmits light or reflects light. The lens unit 171 may include glass, transparent synthetic resin, or the like.

The lens unit 171 may reflect an image by a light signal transmitted from the projector of the frame 170 by a rear surface (for example, a surface of a direction facing an eye of the user) of the lens unit 171 to allow the eye of the user to recognize the image. For example, as shown in the drawing, the user may recognize information such as time and date displayed on the lens unit 171. The lens unit 171 may be a type of the display device, and the display device according to an embodiment described above may be applied to the lens unit 171.

Referring to FIGS. 21, the display device according to an embodiment may be applied to a head mounted display (HMD) including a head mounting band 180 and a display storage case 181. The HMD is a wearable electronic device that may be worn on a head of a user. For example, the HMD may be a wearable device for virtual reality (VR)

The head mounting band 180 may include a portion that connects to the display storage case 181 and fix to the display storage case 181. As shown the drawing, the head mounting band 180 may surround an upper surface and sides of the head of the user, but the disclosure is not limited thereto. The head mounting band 180 may fixed the HMD to the head of the user, and may be formed in an eyeglass frame form or a helmet form.

The display storage case 181 may accommodate the display device and may include at least one lens. The at least one lens may include a portion that provides an image to the user. For example, a display panel according to an embodiment may be applied to a left-eye lens and a right-eye lens in the display storage case 181.

Although the disclosure has been described with reference to the embodiment above, those skilled in the art or those having a common knowledge in the art will understand that the disclosure may be variously modified and changed without departing from the spirit and technical area of the disclosure described in the claims which will be described later.

Therefore, the technical scope of the disclosure should not be limited to the contents described in the detailed description of the specification, but should be defined by the claims.

What is claimed is:

1. A display device comprising:
    a first electrode disposed on a substrate;
    a bonding electrode disposed on the first electrode and electrically connected to the first electrode;
    a light emitting element disposed on the bonding electrode and including:
        a first end contacting the bonding electrode; and
        a second end disposed opposite to the first end in a longitudinal direction;
    a first insulating layer partially covering the light emitting element such that the second end of the light emitting element is exposed;
    a second electrode covering the first insulating layer and the second end of the light emitting element and including a same material;
    a first bank disposed on a portion of the second electrode; and
    a second bank disposed on the first bank, wherein
    the first bank and the second bank include metal
    the first bank contacts a portion of an upper surface of the second electrode and a side surface of the second electrode, and
    the first bank entirely covers the side surface of the second electrode.

2. The display device according to claim 1, wherein the first bank and the second bank include a same material.

3. The display device according to claim 1, wherein the second electrode is electrically connected to the second end of the light emitting element.

4. The display device according to claim 1, wherein the second electrode includes:
    a convex portion partially extending in the longitudinal direction; and
    a flat portion extending in a first direction perpendicular to the longitudinal direction.

5. The display device according to claim 4, wherein
    the convex portion overlaps a portion of the light emitting element and a portion of the first insulating layer, and
    the flat portion overlaps another portion of the first insulating layer.

6. The display device according to claim 1, wherein an upper surface of the first bank and the upper surface of the second electrode have a same height in the longitudinal direction.

7. The display device according to claim 6, wherein
    the first bank directly contacts the second electrode, and
    the first bank and the second electrode have a same potential.

8. The display device according to claim 7, wherein the second bank directly contacts the upper surface of the first bank and at least partially overlaps the first bank.

9. The display device according to claim 8, further comprising:
    a first color conversion layer, a second color conversion layer, and a light scattering layer disposed on the upper surface of the second electrode, wherein
    the first color conversion layer, the second color conversion layer, and the light scattering layer each convert light of different colors.

10. The display device according to claim 1, further comprising:
    a second insulating layer surrounding a side surface of the bonding electrode.

11. The display device according to claim 1, further comprising:
    a third insulating layer surrounding a side surface of the light emitting element.

12. The display device according to claim 1, wherein the light emitting element comprises:
    a first semiconductor layer;
    an active layer disposed on the first semiconductor layer; and
    a second semiconductor layer disposed on the active layer.

13. A method of manufacturing a display device, the method comprising:
    bonding a light emitting stack formed on a stack substrate to a bonding electrode layer formed on a pixel substrate;
    removing the stack substrate;
    forming light emitting elements and bonding electrodes on the pixel substrate by etching the light emitting stack and the bonding electrode layer;
    forming a first insulating layer to cover the light emitting elements and the pixel substrate;
    etching the first insulating layer to expose ends of the light emitting elements;

forming a common electrode to cover the etched first insulating layer and the ends of the light emitting elements that are exposed;

forming a bank layer on the common electrode;

forming first banks by polishing the bank layer;

forming photoresist patterns on an upper surface of the common electrode; and forming second banks between the photoresist patterns, wherein the forming of the first banks comprises:

removing a portion of the bank layer such that upper surfaces of the first banks and the upper surface of the common electrode have a same height.

14. The method according to claim 13, wherein the bank layer includes metal.

15. The method according to claim 14, wherein the first banks and the second banks include a same material.

16. The method according to claim 13, further comprising:

forming a color conversion layer between the second banks by removing a portion of the photoresist patterns.

17. The method according to claim 13, further comprising:

forming a second insulating layer by oxidizing a surface of the bonding electrodes.

18. The method according to claim 13, further comprising:

forming a third insulating layer on side surfaces of the light emitting elements or on side surfaces of the bonding electrodes.

* * * * *